(12) United States Patent
Odate

(10) Patent No.: US 11,654,953 B2
(45) Date of Patent: May 23, 2023

(54) STEERING DEVICE OF VEHICLE

(71) Applicant: HONDA MOTOR CO., LTD., Tokyo (JP)

(72) Inventor: Shotaro Odate, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 17/680,398

(22) Filed: Feb. 25, 2022

(65) Prior Publication Data

US 2022/0306180 A1 Sep. 29, 2022

(30) Foreign Application Priority Data

Mar. 24, 2021 (JP) .............................. JP2021-049970

(51) Int. Cl.
*B62D 1/06* (2006.01)
*H03K 17/96* (2006.01)
*B62D 1/08* (2006.01)

(52) U.S. Cl.
CPC .................. *B62D 1/06* (2013.01); *B62D 1/08* (2013.01); *H03K 17/962* (2013.01); *H03K 2217/96015* (2013.01)

(58) Field of Classification Search
CPC .......... B62D 1/046; B62D 1/06; B62D 1/065; B62D 1/08; B62D 1/10; H03K 17/962
See application file for complete search history.

(56) References Cited

U.S. PATENT DOCUMENTS

| | | | | |
|---|---|---|---|---|
| 2004/0144197 A1* | 7/2004 | O'Grady | .................. | H05B 3/34 74/558 |
| 2017/0079089 A1* | 3/2017 | Okazaki | .................. | H05B 3/20 |
| 2017/0183025 A1* | 6/2017 | Okazaki | .................. | B62D 1/06 |
| 2018/0251146 A1* | 9/2018 | Boittiaux | ............... | B62D 1/046 |
| 2019/0002008 A1* | 1/2019 | Inaba | ........................ | B62D 1/065 |
| 2019/0210629 A1* | 7/2019 | Kwon | .................... | G06F 3/0448 |
| 2021/0371000 A1* | 12/2021 | Nozoe | .................... | G01V 3/088 |

(Continued)

FOREIGN PATENT DOCUMENTS

| | | |
|---|---|---|
| JP | 2016-165940 | 9/2016 |
| JP | 2017-140915 | 8/2017 |
| JP | 2018-203061 | 12/2018 |

(Continued)

OTHER PUBLICATIONS

Japanese Notice of Allowance for Japanese Patent Application No. 2021-049970 dated Nov. 29, 2022.

(Continued)

*Primary Examiner* — Brian J Mcgovern
(74) *Attorney, Agent, or Firm* — Amin, Turocy & Watson, LLP

(57) ABSTRACT

This steering device of a vehicle includes: a steering wheel with a rim portion connected to a spoke portion extending from a hub portion; and a capacitance type of contact sensor that detects a grip of the steering wheel by a driver on the basis of a change in capacitance, wherein the contact sensor includes a detection electrode which is installed in the rim portion to sense a change in capacitance of the rim portion, and a conductive member which is disposed in a region of the spoke portion on a side facing the driver and one end portion of which is in contact with the detection electrode of the rim portion.

7 Claims, 5 Drawing Sheets

(56) References Cited

U.S. PATENT DOCUMENTS

2021/0371001 A1 * 12/2021 Osako .................... G01D 5/24

FOREIGN PATENT DOCUMENTS

| JP | 2019-023009 | 2/2019 | | |
|----|-------------|--------|---|---|
| JP | 2019-202446 | 11/2019 | | |
| JP | 2020-040436 | 3/2020 | | |
| WO | WO-2021099345 A1 * | 5/2021 | ............. | B62D 1/046 |

OTHER PUBLICATIONS

Japanese Office Action for Japanese Patent Application No. 2021-049970 dated Sep. 13, 2022.

* cited by examiner

STEERING DEVICE OF VEHICLE

CROSS-REFERENCE TO RELATED APPLICATION

The present application claims priority based on Japanese Patent Application No. 2021-049970, filed Mar. 24, 2021, the content of which is incorporated herein by reference.

BACKGROUND OF THE INVENTION

Field of the Invention

The present invention relates to a steering device of a vehicle having a function of detecting the grip of a steering wheel by a driver.

Description of Related Art

Some steering devices of a vehicle include a detection sensor that detects whether or not a driver is gripping a steering wheel. As a detection method of this detection sensor, a capacitance type of detection method is known (refer to, for example, Japanese Unexamined Patent Application, First Publication No. 2016-165940).

A steering device described in Japanese Unexamined Patent Application, First Publication No. 2016-165940, has a basic configuration in which a detection electrode made of a conductive metal is disposed in an outer layer portion of a rim portion of a steering wheel and a change in capacitance sensed in the detection electrode is detected with a capacitance detection circuit.

SUMMARY OF THE INVENTION

In the steering device described in Japanese Unexamined Patent Application, First Publication No. 2016-165940, the detection electrode is disposed in an annular shape in a peripheral region of the rim portion of the steering wheel. Therefore, even in a case where the driver grips any part of the rim portion, the grip by the driver can be detected. However, when driving the vehicle, the driver may grip not only a rim portion but also a spoke portion, and in this case, the above-mentioned detection electrode cannot detect the grip of the spoke portion. Therefore, even in a case where the driver grips the spoke portion, it is desired that the grip can be detected.

As a countermeasure, it is conceivable to extend the detection electrode not only in the rim portion but also in the spoke portion, but in that case, the structure of the detection electrode becomes complicated and it becomes difficult to manufacture the detection electrode.

Therefore, an object of an aspect of the present invention is to provide a steering device of a vehicle capable of detecting changes in capacitance of a rim portion and a spoke portion without complicating a structure of a detection electrode.

In order to achieve the above object, a steering device of a vehicle according to an aspect of the present invention employs the following configurations.

(1) An aspect of the present invention includes: a steering wheel (for example, a steering wheel 10 of an embodiment) with a rim portion (for example, a rim portion 12 of the embodiment) connected to a spoke portion (for example, a spoke portion 13 of the embodiment) extending from a hub portion (for example, a hub portion 11 of the embodiment); and a capacitance type of contact sensor (for example, a contact sensor 32 of the embodiment) that detects a grip of the steering wheel by a driver on the basis of a change in capacitance, wherein the contact sensor includes a detection electrode (for example, a detection electrode 18 of the embodiment) which is installed in the rim portion to sense a change in capacitance of the rim portion, and a conductive member (for example, a conductive member 31 of the embodiment) which is disposed in a region of the spoke portion on a side facing the driver and one end portion of which is in contact with the detection electrode of the rim portion.

According to the aspect (1) described above, in a case where the driver grips the rim portion, the detection electrode disposed in the rim portion senses the change in capacitance due to the grip. Further, in a case where the driver grips the spoke portion, the detection electrode disposed in the rim portion senses the change in capacitance due to the grip through the conductive member disposed in the spoke portion. Therefore, in the present configuration, it is possible to detect the changes in capacitance of the rim portion and the spoke portion using a common detection electrode.

(2) In the aspect (1) described above, the other end portion of the conductive member may be fixed to a grounding member (for example, a grounding member 43 of the embodiment) provided in the hub portion.

According to the aspect (2) described above, the conductive member can be fixed to the hub portion via the grounding member, and the contact sensor can be grounded via the conductive member and the grounding member. Therefore, a structure of the contact sensor can be simplified.

(3) In the aspect (2) described above, the conductive member may have substantially a U-shape in a front view in which a region on a side in contact with the detection electrode is a curved top portion.

According to the aspect (3) described above, the end portion of the conductive member on a contact portion side with the detection electrode has a shape corresponding to the curved top portion having substantially a U-shape, and thus it is possible to reliably detect the contact of a hand of the driver with a portion of the spoke portion close to the rim portion via the conductive member.

(4) In the aspect (3) described above, a contact portion (for example, a contact portion 36 of the embodiment) of the conductive member with the detection electrode may have a main contact region (for example, a main contact region 36a of the embodiment) substantially along an arc on an inner peripheral side of the rim portion and a small arc region (for example, a small arc region 36b of the embodiment) which is continuous with the main contact region and has an arc shape having a smaller diameter than the arc on the inner periphery side of the rim portion.

According to the aspect (4) described above, the conductive member is in contact with the detection electrode not only in the main contact region substantially along the arc on the inner peripheral side of the rim portion but also in the small arc region. Therefore, a conduction state of the conductive member with respect to the detection electrode can be stabilized. Therefore, a detection sensitivity of the capacitance in the spoke portion can be further increased.

(5) In the aspect (4) described above, the rim portion may include a skin member (for example, a skin member 19 of the embodiment) that covers an outer side of the detection electrode, and the skin member may have a cutout portion (for example, a cutout portion 38 of the embodiment) along the main contact region and the small arc region.

According to the aspect (5) described above, even in a structure in which the rim portion is provided with the skin member that covers the detection electrode, the contact portion (the main contact region and the small arc region) of the conductive member with the detection electrode is exposed to the outside through the cutout portion of the skin member. Therefore, the contact of a hand of the driver with the portion of the spoke portion close to the rim portion can be reliably detected via the conductive member.

(6) In the aspect (4) or (5) described above, a sensor control unit (for example, a sensor control unit 39 of the embodiment) for the contact sensor may be disposed in the spoke portion, the one end portion of the conductive member disposed in the spoke portion may be disposed to overlap the detection electrode in a contact state, a separation portion (for example, a gap 37 of the embodiment) that is opened toward the hub portion may be provided in the contact portion of the detection electrode with the conductive member, and a wiring (for example, a wiring 30 of the embodiment) that connects the sensor control unit and the detection electrode may be disposed in the separation portion over a lower portion of the contact portion of the conductive member.

According to the aspect (6) described above, the wiring that connects the sensor control unit and the detection electrode is led out toward the hub portion through the separation portion of the detection electrode and over the lower portion of the conductive member, and thus it is possible to protect the wiring from an external force applied to the steering wheel. Further, when the present configuration is employed, the wiring connected to each detection electrode can be easily led out toward the hub portion (on a side of the sensor control unit).

(7) In the aspect of any one of (2) to (6) described above, the other end portion of the conductive member may be provided with a connection piece (for example, a connection piece 41 of the embodiment) which is fixed to the grounding member in a posture substantially parallel to a surface of the rim portion facing a side of a driver seat, and the connection piece may be provided with a drainage groove (for example, a drainage groove 44 of the embodiment) extending in a vertical direction when the steering wheel is in a neutral steering position.

According to the aspect (7) described above, the connection piece in the other end portion of the conductive member is fixed to the grounding member in a posture substantially parallel to the surface of the rim portion facing the side of the driver seat, and thus it is possible to easily fix the connection piece to the grounding member from a front side (a side facing the side of the driver seat) of the steering wheel. Further, in a case where water droplets flow into the periphery of the connection piece fixed to the grounding member in this way for some reason, the water droplets can be discharged downward through the drainage groove extending in the vertical direction.

(8) In the aspect (6) described above, the sensor control unit may be disposed in an inner region of a portion where the conductive member has substantially a U-shape in a front view.

According to the aspect (8) described above, the sensor control unit is disposed in the inner region of the portion where the conductive member has substantially a U-shape in a front view, and thus a wiring distance between the sensor control unit and the detection electrode can be shortened, and the conductive member and the sensor control unit can be efficiently laid out in the spoke portion.

According to the aspects of the present invention, the conductive member is disposed in the region of the spoke portion on a side facing the driver, and one end portion of the conductive member is in contact with the detection electrode of the rim portion. Therefore, in a case where the steering device of a vehicle of the present invention is employed, it is possible to detect the changes in capacitance of the rim portion and the spoke portion using the common detection electrode without causing the detection electrode disposed in the rim portion to have a complicated shape extending to the spoke portion.

DESCRIPTION OF EMBODIMENTS

Hereinafter, an embodiment of the present invention will be described with reference to the drawings.

Figure 1:
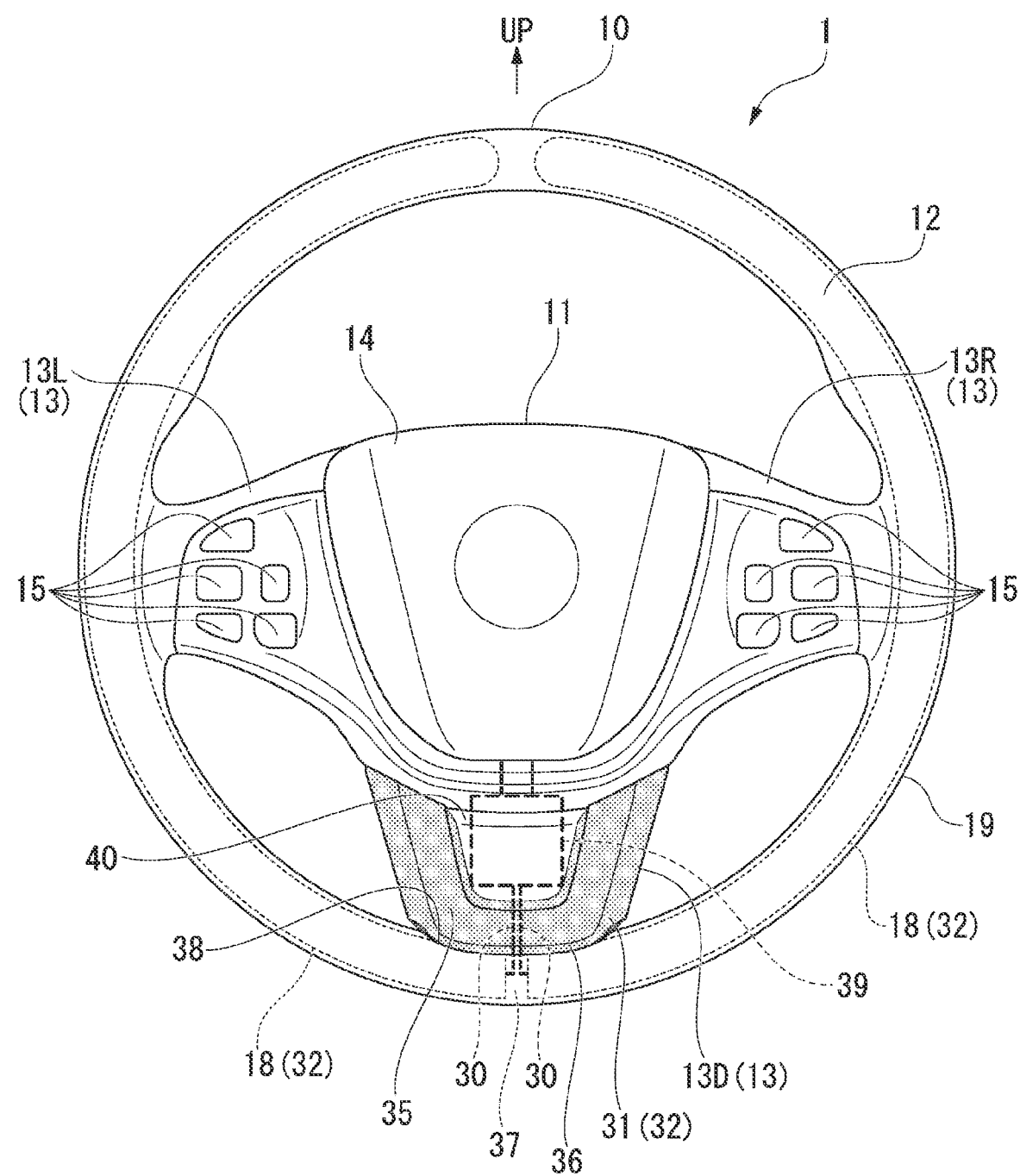
FIG. 1 is a front view of a steering device of an embodiment.

FIG. 1 is a front view of a steering device 1 of an embodiment.

The steering device 1 includes a steering wheel 10 connected to a steering shaft (not shown). The steering wheel 10 includes a hub portion 11 coupled to the steering shaft to be able to rotate integrally therewith, an annular rim portion 12 disposed radially outside the hub portion 11, and three spoke portions 13 that extend radially outward from the hub portion 11 and connect the hub portion 11 and the rim portion 12. A horn operation portion 14 is disposed on a front surface of the hub portion 11 facing a driver seated in a driver seat (a surface facing a rear side of a vehicle). An airbag device (not shown) is built in a back side of the horn operation portion 14.

FIG. 1 shows a state in which the steering wheel 10 is in a neutral steering position. Unless otherwise specified, up, down, left, and right in description of the spoke portion 13 below are directions with respect to the steering wheel 10 in a neutral steering position.

Two of the three spoke portions 13 extend from the hub portion 11 in opposite directions to the left and right, and end portions thereof in extending directions are connected to the rim portion 12. The remaining spoke portion 13 extends downward from the hub portion 11, and an end portion thereof in an extending direction is connected to the rim portion 12. Hereinafter, in cases where the three spoke portions 13 are distinguished, the spoke portion 13 extending to the left from the hub portion 11 is referred to as a left spoke portion 13L, and the spoke portion 13 extending to the right from the hub portion 11 is referred to as a right spoke portion 13R. Further, the spoke portion 13 extending downward from the hub portion 11 is referred to as a lower spoke portion 13D.

A plurality of operation switches 15 that output operation signals to control units of in-vehicle devices (not shown) by switch operations are disposed on front surfaces (the surfaces facing the rear side of the vehicle) of each of the left spoke portion 13L and the right spoke portion 13R. The in-vehicle devices to which the operation signals are output by the operations of the operation switches 15 are, for example, an audio-related device, a liquid crystal panel display device, a traveling mode switching device, and the like.

Figure 2:
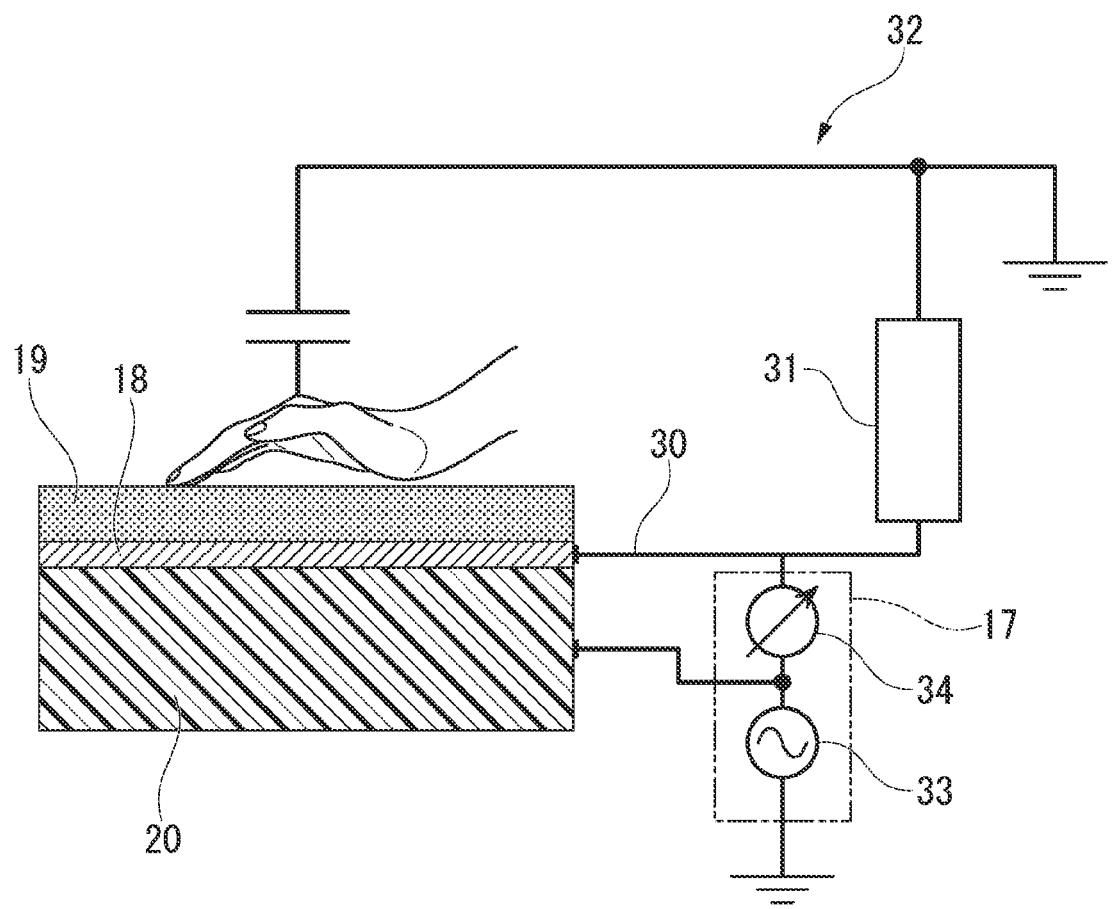
FIG. 2 is a schematic configuration diagram showing a detection principle of a contact sensor of the embodiment.

FIG. 2 is a schematic configuration diagram showing a detection principle of the steering grip in the steering device 1. In FIG. 2, a part of the steering wheel 10 is shown as a cross section. The cross section of the steering wheel 10 in FIG. 2 is an image of a cross section of a region from a surface of the rim portion 12 toward an inner center side thereof. Reference sign 20 in FIG. 2 is a resin layer such as a urethane layer on a center side of the rim portion 12, and reference sign 19 is a skin member that covers an outer side of the rim portion 12.

An annular core metal (not shown) is embedded in the rim portion 12 of the steering wheel 10, and the resin layer 20 shown in FIG. 2 is disposed around the core metal. A sheet-shaped detection electrode 18 made of a conductive member is adhered to an outer peripheral side of the resin layer 20. The skin member 19 is made of non-conductive leather or the like and is attached to an outer peripheral side of the detection electrode 18 and the resin layer 20 to wrap them. The detection electrode 18 disposed in the rim portion 12 does not necessarily have to be in the shape of a sheet and may be, for example, a conductive metal lead wire, a metal plate, a metal plated layer, a conductive paint, or the like.

The detection electrode 18 is a member for sensing a capacitance that changes when the driver grips the rim portion 12 and is connected to a capacitance detection circuit 17 through a wiring 30 as shown in FIG. 2. One end portion of the conductive member 31 of the lower spoke portion 13D, which will be described in detail later, is connected to the detection electrode 18. In the present embodiment, the detection electrode 18, the conductive member 31, and the capacitance detection circuit 17 constitute a capacitance type contact sensor 32.

The capacitance detection circuit 17 includes an AC power supply 33 that energizes the detection electrode 18 and the conductive member 31, and a current sensor 34 that detects a current proportional to changes in capacitance of the detection electrode 18 and the conductive member 31. When the driver grips the vicinity of the detection electrode 18 or the vicinity of the conductive member 31, the capacitance detection circuit 17 detects the change in capacitance generated in that portion on the basis of the detection current of the current sensor 34.

Figure 3:
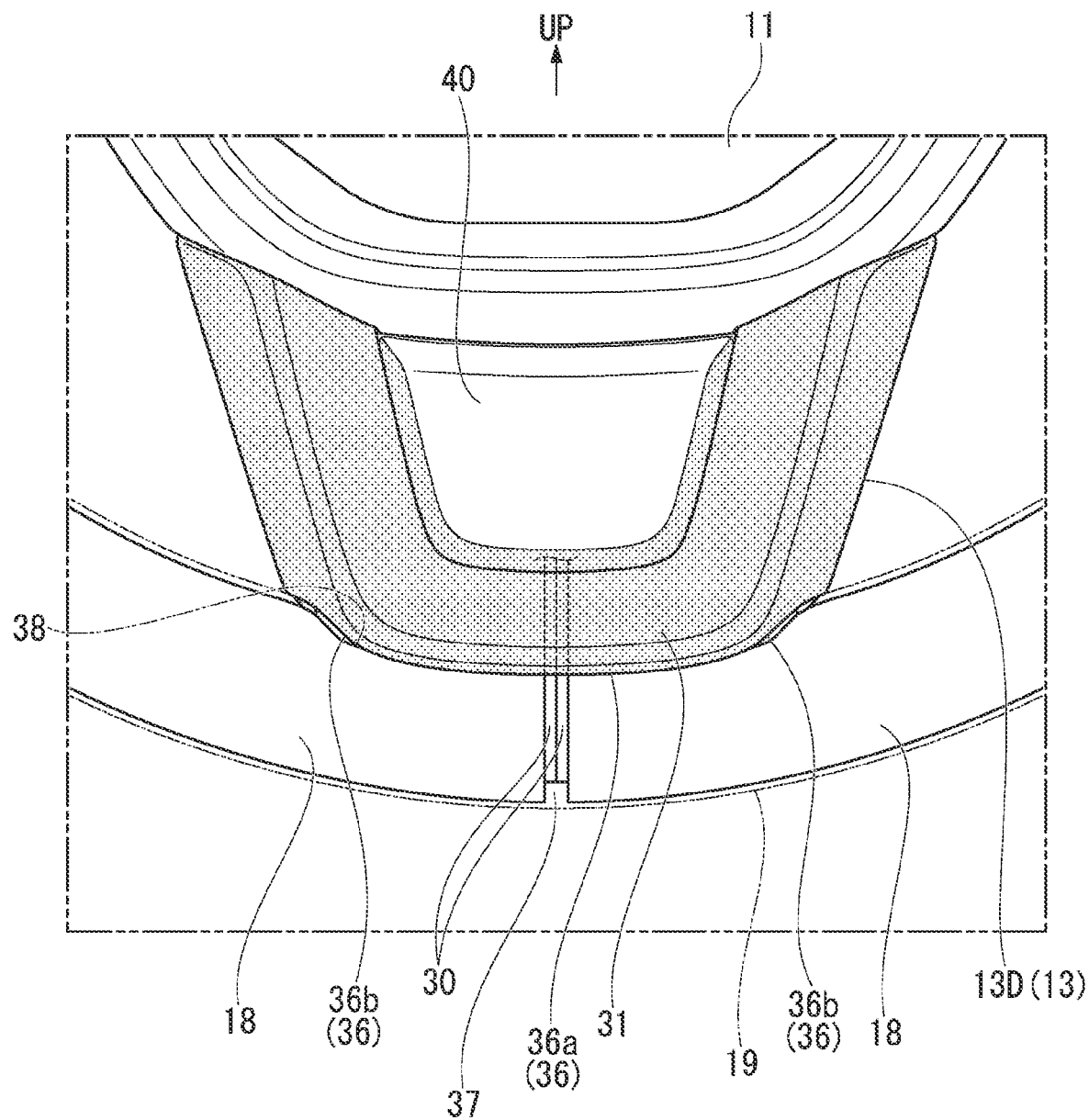
FIG. 3 is a front view of a part of a steering wheel from which a skin member of a rim portion of the embodiment is removed.

FIG. 3 is an enlarged front view showing a lower region of the steering wheel 10 from which the skin member 19 of the rim portion 12 is removed.

As shown in FIGS. 1 and 3, a spoke portion cover 35 made of resin which has substantially a U-shape in a front view is attached to a front surface of the lower spoke portion 13D of the steering wheel 10 (a region on a side facing an upper body of the driver). The spoke portion cover 35 is provided with a conductive metal plated layer on an outer surface and a part of a back surface side thereof. The plated layer constitutes the above-mentioned conductive member 31. The conductive member 31 formed of the plated layer has substantially a U-shape in a front view similar to an outer surface of the spoke portion cover 35. Specifically, the conductive member 31 has substantially a U-shape in a front view in which a side close to the rim portion 12 is a curved top portion. A region (one end portion) corresponding to the curved top portion of the conductive member 31 is in contact with the detection electrode 18 disposed inside the skin member 19 of the rim portion 12. As a result, the detection electrode 18 and the conductive member 31 are electrically conductive with each other.

As shown in FIG. 3, a contact portion 36 of the conductive member 31 with the detection electrode 18 has a main contact region 36a substantially along an arc on an inner peripheral side of the rim portion 12 and a pair of small arc regions 36b that are continuous with front and rear end portions of the main contact region 36a in a circumferential direction of the rim portion 12. The arc of the small arc region 36b has a smaller diameter than the arc of the inner peripheral surface of the rim portion 12. In the contact portion 36 of the conductive member 31, the main contact region 36a and the small arc regions 36b in the front and rear end portions are overlapped on an outer surface of the detection electrode 18, and a contact state (an electrical conduction state) is maintained in that state.

Here, in the steering device 1 of the present embodiment, two detection electrodes 18 are disposed on a circumference of the rim portion 12. One detection electrode 18 is disposed over a region of a right half of the circumference of the rim portion 12 from a lower end position (a connection position with the lower spoke portion 13D) of the rim portion 12, and the other detection electrode 18 is disposed over a region of a left half of the circumference of the rim portion 12 from a lower end position (a connection position with the lower spoke portion 13D) of the rim portion 12. As shown in FIG. 3, end portions of one detection electrode 18 and the other detection electrode 18 face each other with a gap 37 interposed therebetween at the lower end position of the circumference of the rim portion 12. In the present embodiment, the gap 37 between one detection electrode 18 and the other detection electrode 18 constitutes a separation portion that is opened toward the hub portion 11. The contact portion 36 of the conductive member 31 disposed in the lower spoke portion 13D is in contact with one detection electrode 18 and the other detection electrode 18 over them.

As shown in FIGS. 1 and 3, the skin member 19 covering the outer side of the rim portion 12 is provided with a cutout portion 38 along the main contact region 36a and the small arc region 36b of the conductive member 31. As a result, the main contact region 36a and the small arc region 36b of the conductive member 31 are exposed to the outside of the skin member 19 through the cutout portion 38.

Further, as shown in FIG. 1, a sensor control unit 39 including the capacitance detection circuit 17 (see FIG. 2) is disposed in the lower spoke portion 13D. The sensor control unit 39 receives a detection command from an integrated control unit of the vehicle or the like and detects a grip state of the steering wheel 10 by the driver through the capacitance detection circuit 17.

The sensor control unit 39 is disposed in an inner region of a portion where the conductive member 31 has substantially a U-shape in a front view. A front side (a side facing an upper body of the driver) of the sensor control unit 39 is covered with a resin unit cover 40. The unit cover 40 is disposed inside the spoke portion cover 35 having substantially a U-shape in a front view.

Figure 4:
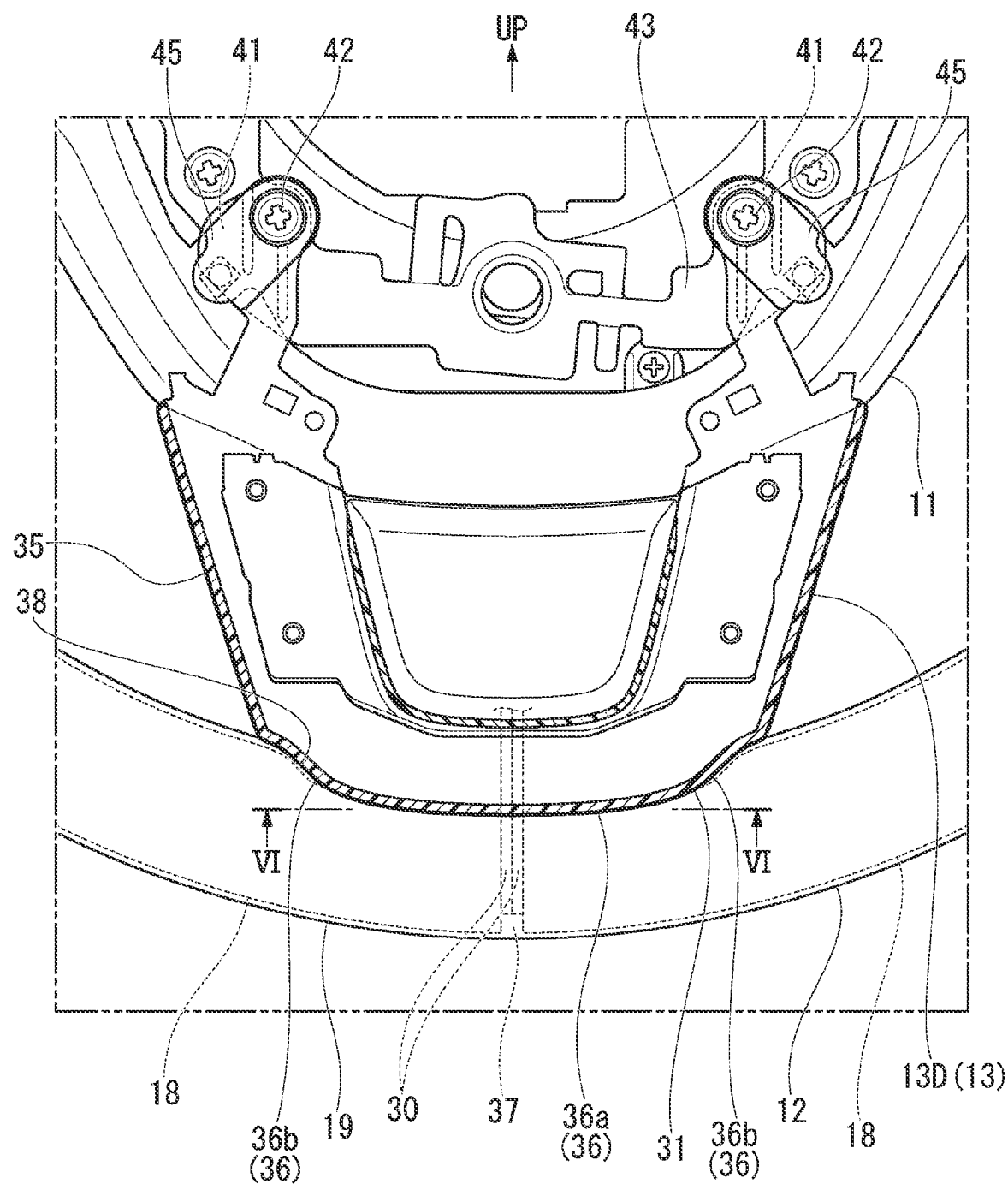
FIG. 4 is a front view of the steering wheel with a part of a spoke cover (a conductive member) of the embodiment broken.

FIG. 4 is a front view showing an enlarged lower region of the steering wheel 10 with the horn operation portion 14 removed and a part of the spoke portion cover 35 (the conductive member 31) broken.

A pair of flat plate-shaped connection pieces 41 extending upward are provided on the other end portion side (an upper end side) of the spoke portion cover 35 having substantially a U-shape in a front view. The connection pieces 41 extend to each upper end portion on an opening side of the spoke portion cover 35 having substantially a U shape. The connection piece 41 is fixed to a grounding member 43 (an earthing member) made of a conductive metal which is fixedly installed on the hub portion 11. The connection piece 41 is superposed on the grounding member 43 (the earthing member) in a posture substantially parallel to a surface of the rim portion 12 facing a side of the driver seat (a front surface of the rim portion 12) and in that state, is fixed to the grounding member 43 with a fastening member 42 such as a bolt or the like. A surface of each connection piece 41 is plated with a conductive metal to be continuous with the conductive member 31. Therefore, an upper end portion (the other end portion) of the conductive member 31 is electrically connected to the grounding member 43 via the pair of connection pieces 41.

In the case of the present embodiment, a fixing portion of the grounding member 43 with each connection piece 41 is provided with a sandwiching piece 45 having a clip structure for sandwiching the connection piece 41 from above. Each connection piece 41 is fastened and fixed to the grounding member 43 in a state of being sandwiched between the sandwiching pieces 45.

Figure 5:
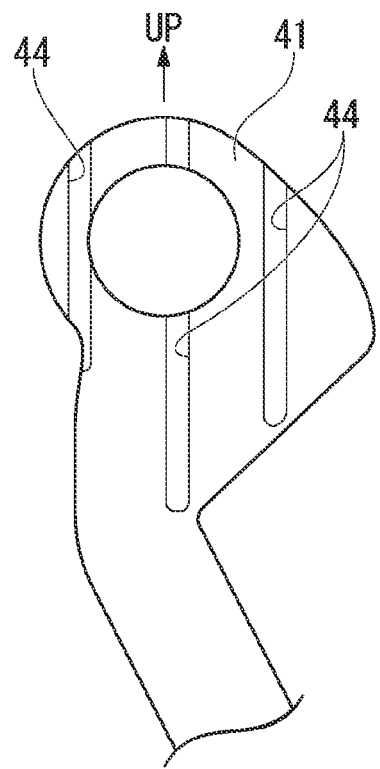
FIG. 5 is a back view of a connection piece of the embodiment.

FIG. 5 is a view of the connection piece 41 as viewed from a back surface side (a side of a surface in contact with the grounding member 43). As shown in FIG. 5, a drainage groove 44 extending in a vertical direction in a state where the steering wheel 10 is in a neutral steering position is formed in a back surface or a front surface of each connection piece 41. When water droplets flow into an upper side of a fastening portion between the connection piece 41 and the grounding member 43, the water droplets can be discharged downward through the drainage groove 44 of the connection piece 41.

Figure 6:
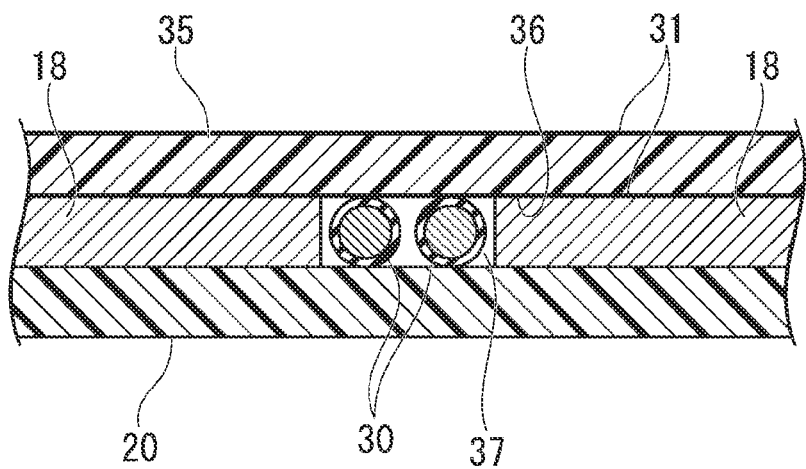
FIG. 6 is a cross-sectional view along line VI-VI of FIG. 4.

FIG. 6 is a cross-sectional view along line VI-VI of FIG. 4.

As shown in FIG. 6, the wiring 30 that connects the sensor control unit 39 and each detection electrode 18 over a lower portion of the conductive member 31 (the contact portion 36) of the lower spoke portion 13D is disposed in the gap 37 (the separation portion) between the two detection electrodes 18 at the lower end of the rim portion 12. Further, the sensor control unit 39 is wired and connected to the integrated control unit of the vehicle via the hub portion 11 and the steering shaft (not shown).

In the above configuration, when the rim portion 12 of the steering wheel 10 is gripped by the driver, the capacitance of the detection electrode 18 in the rim portion 12 increases. Further, when the spoke portion cover 35 (the conductive member 31) of the lower spoke portion 13D is gripped (touched) by the driver, the capacitances of the conductive member 31 and the detection electrode 18 increase. These increases in capacitance are detected by the sensor control unit 39 (the capacitance detection circuit 17).

In the steering device 1 of the present embodiment, the conductive member 31 is disposed in the region of the lower spoke portion 13D on a side facing the driver, and one end portion of the conductive member 31 is in contact with the detection electrode 18 of the rim portion 12. Therefore, in a case where the steering device 1 of the present embodiment is employed, it is possible to detect the changes in capacitance of the rim portion 12 and the lower spoke portion 13D using the common detection electrode 18 without causing the detection electrode 18 disposed in the rim portion 12 to have a complicated shape extending to the spoke portion 13.

In the present embodiment, the conductive member 31 in contact with the detection electrode 18 in the rim portion 12 is provided in the lower spoke portion 13D, but the conductive member 31 in contact with the detection electrode 18 can also be provided in another spoke portion 13 such as the left spoke portion 13L or the right spoke portion 13R.

Further, in the steering device 1 of the present embodiment, the upper end side (the other end portion side) of the conductive member 31 (the spoke portion cover 35) is fixed to the grounding member 43 fixed to the hub portion 11. Therefore, in this configuration, the conductive member 31 can be fixed to the hub portion 11 via the grounding member 43, and the contact sensor 32 can be grounded via the conductive member 31 and the grounding member 43. Therefore, in a case where this configuration is employed, a structure of the contact sensor 32 can be simplified.

Further, in the steering device 1 of the present embodiment, the conductive member 31 has substantially a U-shape in a front view in which the region on the side in contact with the detection electrode 18 is the curved top portion. Therefore, the contact of a hand of the driver with a portion of the lower spoke portion 13D (the spoke portion 13) close to the rim portion 12 can be stably detected via the conductive member 31.

Further, in the steering device 1 of the present embodiment, the contact portion 36 of the conductive member 31 with the detection electrode 18 has the main contact region 36a substantially along the arc on the inner peripheral side of the rim portion and the small arc regions 36b that are continuous with the main contact region 36a. Therefore, the conductive member 31 can be stably brought into contact with the detection electrode 18 in a wider area, and the conduction state between the conductive member 31 and the detection electrode 18 can be stabilized. Therefore, when the present configuration is employed, a detection sensitivity of the capacitance in the spoke portion 13 can be further increased.

Further, in the steering device 1 of the present embodiment, the skin member 19 covering the outer side of the detection electrode 18 of the rim portion 12 is provided with the cutout portion 38 along the main contact region 36a and the small arc region 36b of the conductive member 31. Therefore, even in a structure in which the rim portion 12 is provided with the skin member 19 that covers the detection electrode 18, the contact portion 36 (the main contact region 36a and the small arc region 36b) of the conductive member 31 with the detection electrode 18 is exposed to the outside of the skin member 19. Therefore, in a case where the present configuration is employed, when the hand of the driver touches a portion of the spoke portion 13 (the lower spoke portion 13D) close to the rim portion 12, it is possible to reliably detect the contact via the conductive member 31.

Further, in the steering device 1 of the present embodiment, a lower end portion (one end portion) of the conductive member 31 is in contact with the left and right detection electrodes 18 over them, and the wiring 30 that connects the left and right detection electrodes 18 and the sensor control unit 39 is disposed in the gap 37 (the separation portion) between the left and right detection electrodes 18. Then, the wiring 30 is led out toward the hub portion 11 over the lower portion of the contact portion 36 in a lower end of the conductive member 31. Therefore, the wiring 30 that connects the left and right detection electrodes 18 and the sensor control unit 39 can be protected from an external force applied to the steering wheel 10. Further, in a case where the present configuration is employed, the wiring 30 connected to each detection electrode 18 can be easily led out toward the hub portion 11 (on a side of the sensor control unit 39). In the present embodiment, the left and right detection electrodes 18 are described as separate bodies, but seamless and integrated detection electrodes 18 in which the gap 37 is disposed to be provided in a lower portion of the steering wheel 10 may be used. Further, in this case, a configuration in which the wiring 30 is led out from either a left end portion or a right end portion of the detection electrode 18 toward the gap may be used.

Further, in the steering device 1 of the present embodiment, the flat plate-shaped connection pieces 41 which are fixed to the grounding member 43 in a posture substantially parallel to the surface of the rim portion 12 facing the side of the driver seat are provided on the upper end portion side (the other end portion) of the conductive member 31. Therefore, the connection pieces 41 of the conductive member 31 can be easily fixed to the grounding member 43 from a front side (a side facing the side of the driver seat) of the steering wheel 10. Further, in the present embodiment, the drainage groove 44 extending in the vertical direction is formed in the connection piece 41 facing the grounding member 43. Therefore, in a case where water droplets flow into the periphery of the connection piece 41 fixed to the grounding member 43 for some reason, the water droplets can be smoothly discharged downward through the drainage groove 44 extending in the vertical direction.

Further, in the steering device 1 of the present embodiment, the sensor control unit 39 is disposed in the inner region of the portion where the conductive member 31 has substantially a U-shape in a front view. Therefore, in a case where the present configuration is employed, a wiring distance between the sensor control unit 39 and the detection electrode 18 can be shortened, and the conductive member 31 and the sensor control unit 39 can be efficiently laid out in the spoke portion 13.

The present invention is not limited to the above embodiment, and various design changes can be made without departing from the gist thereof.

For example, in the above embodiment, the contact portion 36 (the main contact region 36*a* and the small arc region 36*b*) of the conductive member 31 with the detection electrode 18 is exposed to the outside of the skin member 19 through the cutout portion 38, but the contact portion 36 of the conductive member 31 with the detection electrode 18 may be covered from the outside with the skin member 19. In this case, the contact portion 36 of the conductive member 31 with the detection electrode 18 cannot be seen from the outside, and thus the appearance is improved, and poor contact in the contact portion between the conductive member 31 and the detection electrode 18 can be suppressed due to pressing of the skin member 19.

What is claimed is:

1. A steering device of a vehicle, comprising:
   a steering wheel with a rim portion connected to a spoke portion extending from a hub portion; and
   a capacitance type of contact sensor that detects a grip of the steering wheel by a driver on the basis of a change in capacitance,
   wherein the contact sensor includes
   a detection electrode which is installed in the rim portion to sense a change in capacitance of the rim portion, and
   a conductive member which is disposed in a region of the spoke portion on a side facing the driver and one end portion of which is in contact with the detection electrode of the rim portion,
   wherein a sensor control unit for the contact sensor is disposed in the spoke portion,
   wherein the one end portion of the conductive member disposed in the spoke portion is disposed to overlap the detection electrode in a contact state,
   wherein a separation portion that is opened toward the hub portion is provided in the contact portion of the detection electrode with the conductive member, and
   wherein a wiring that connects the sensor control unit and the detection electrode is disposed in the separation portion over a lower portion of the contact portion of the conductive member.

2. The steering device of a vehicle according to claim 1, wherein another end portion of the conductive member is fixed to a grounding member provided in the hub portion.

3. The steering device of a vehicle according to claim 1, wherein the conductive member has substantially a U-shape in a front view in which a region on a side in contact with the detection electrode is a curved top portion.

4. The steering device of a vehicle according to claim 3, wherein the contact portion of the conductive member with the detection electrode has a main contact region substantially along an arc on an inner peripheral side of the rim portion and a secondary arc region which is continuous with the main contact region and has an arc shape having a smaller diameter than the arc on the inner peripheral side of the rim portion.

5. The steering device of a vehicle according to claim 4, wherein the rim portion includes a skin member that covers an outer side of the detection electrode, and
   wherein the skin member has a cutout portion along the main contact region and the secondary arc region.

6. The steering device of a vehicle according to claim 1, wherein the sensor control unit is disposed in an inner region of a portion where the conductive member has substantially a U-shape in a front view.

7. A steering device of a vehicle, comprising:
   a steering wheel with a rim portion connected to a spoke portion extending from a hub portion; and
   a capacitance type of contact sensor that detects a grip of the steering wheel by a driver on the basis of a change in capacitance, wherein the contact sensor includes
   a detection electrode which is installed in the rim portion to sense a change in capacitance of the rim portion, and
   a conductive member which is disposed in a region of the spoke portion on a side facing the driver and a first end portion the conductive member is in contact with the detection electrode of the rim portion,
   wherein a second end portion of the conductive member is fixed to a grounding member provided in the hub portion,
   wherein the second end portion of the conductive member is provided with a connection piece which is fixed to the grounding member in a posture substantially parallel to a surface of the rim portion facing a side of a driver seat, and
   wherein the connection piece is provided with a drainage groove extending in a vertical direction when the steering wheel is in a neutral steering position.

* * * * *